(12) United States Patent
Wagenleitner

(10) Patent No.: US 9,595,094 B2
(45) Date of Patent: Mar. 14, 2017

(54) MEASURING FORM CHANGES OF A SUBSTRATE

(75) Inventor: Thomas Wagenleitner, Aurolzmunster (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 220 days.

(21) Appl. No.: 14/348,639

(22) PCT Filed: Nov. 14, 2011

(86) PCT No.: PCT/EP2011/070023
§ 371 (c)(1),
(2), (4) Date: Mar. 31, 2014

(87) PCT Pub. No.: WO2013/071943
PCT Pub. Date: May 23, 2013

(65) Prior Publication Data
US 2014/0226894 A1    Aug. 14, 2014

(51) Int. Cl.
*G06T 7/00* (2006.01)
*G01B 11/14* (2006.01)
(Continued)

(52) U.S. Cl.
CPC ............ *G06T 7/0004* (2013.01); *G01B 11/14* (2013.01); *G01B 11/16* (2013.01); *G01B 11/24* (2013.01); *H01L 22/12* (2013.01)

(58) Field of Classification Search
CPC ......... G01B 11/14; G01B 11/16; G01B 11/24; G01B 11/28; G01B 11/30; G01B 11/165;
(Continued)

(56) References Cited

U.S. PATENT DOCUMENTS 3,068,743 A * 12/1962 Dyson ................ G01B 9/04
356/390
5,604,779 A * 2/1997 Amemiya ............ G03F 7/2039
378/146
(Continued)

FOREIGN PATENT DOCUMENTS

DE     102004059018     6/2006    ............ B23Q 17/22
JP     H-10122814 A     5/1998    ............ G01B 11/00
(Continued)

OTHER PUBLICATIONS

Office Action received in corresponding Japanese Patent Application No. 2014-540327.
(Continued)

*Primary Examiner* — Gordon J Stock, Jr.
(74) *Attorney, Agent, or Firm* — Kusner & Jaffe

(57) ABSTRACT

The present invention relates to a device and method for determining changes in the shape of a substrate parallel to its substrate surface. The device comprises
  at least one detection apparatus for detecting images of structures which are located on the substrate surface, and
  optics comprised of at least two optics apparatus with at least two different beam paths for imaging of the structures on the detection apparatus.
The device is able to determine distances ($dx_1$, $dy_1$, $dx_2$, $dy_2$, $dx_n$, $dy_n$) of images of the structures and/or changes of the distances ($dx_1$, $dy_1$, $dx_2$, $dy_2$, $dx_n$, $dy_n$).

13 Claims, 5 Drawing Sheets

(51) Int. Cl.
 *G01B 11/24* (2006.01)
 *G01B 11/16* (2006.01)
 *H01L 21/66* (2006.01)

(58) Field of Classification Search
 CPC ... G01B 11/285; G01B 11/303; G01B 11/306; G01B 2210/56; G06T 7/0004; H01L 22/12; G03F 7/70641; G03F 9/7088; G03F 9/7084; G01N 21/88; G01N 21/8803; G01N 21/8806; G01N 21/898; G01N 21/9501
 See application file for complete search history.

(56) References Cited

U.S. PATENT DOCUMENTS

| | | | | |
|---|---|---|---|---|
| 5,625,457 | A * | 4/1997 | Ogawa | G01B 11/16 356/390 |
| 5,790,257 | A * | 8/1998 | Kim | G03F 9/70 356/401 |
| 5,978,081 | A | 11/1999 | Michael et al. | 356/243.1 |
| 6,433,352 | B1 * | 8/2002 | Oka | G03F 7/70425 250/559.3 |
| 8,473,237 | B2 * | 6/2013 | Huebel | G01B 11/03 356/620 |
| 2002/0131632 | A1 * | 9/2002 | Vernackt | G03F 9/00 382/151 |
| 2003/0087597 | A1 * | 5/2003 | Ohkouchi | H01L 21/67276 454/187 |
| 2004/0212801 | A1 * | 10/2004 | Wu | G03F 9/7088 356/400 |
| 2007/0222991 | A1 * | 9/2007 | Spady | G02B 7/00 356/401 |
| 2007/0252994 | A1 * | 11/2007 | Bijnen | H01L 21/67092 356/401 |
| 2008/0062436 | A1 * | 3/2008 | Inaoka | B41J 2/161 356/620 |
| 2010/0177953 | A1 | 7/2010 | Hayashi et al. | 382/145 |

FOREIGN PATENT DOCUMENTS

| | | | |
|---|---|---|---|
| JP | 2003-214816 A | 7/2003 | ............ G01B 11/00 |
| WO | WO 01/20255 | 3/2001 | ............ G01B 11/24 |

OTHER PUBLICATIONS

International Search for International Application PCT/EP2011/070023.

* cited by examiner

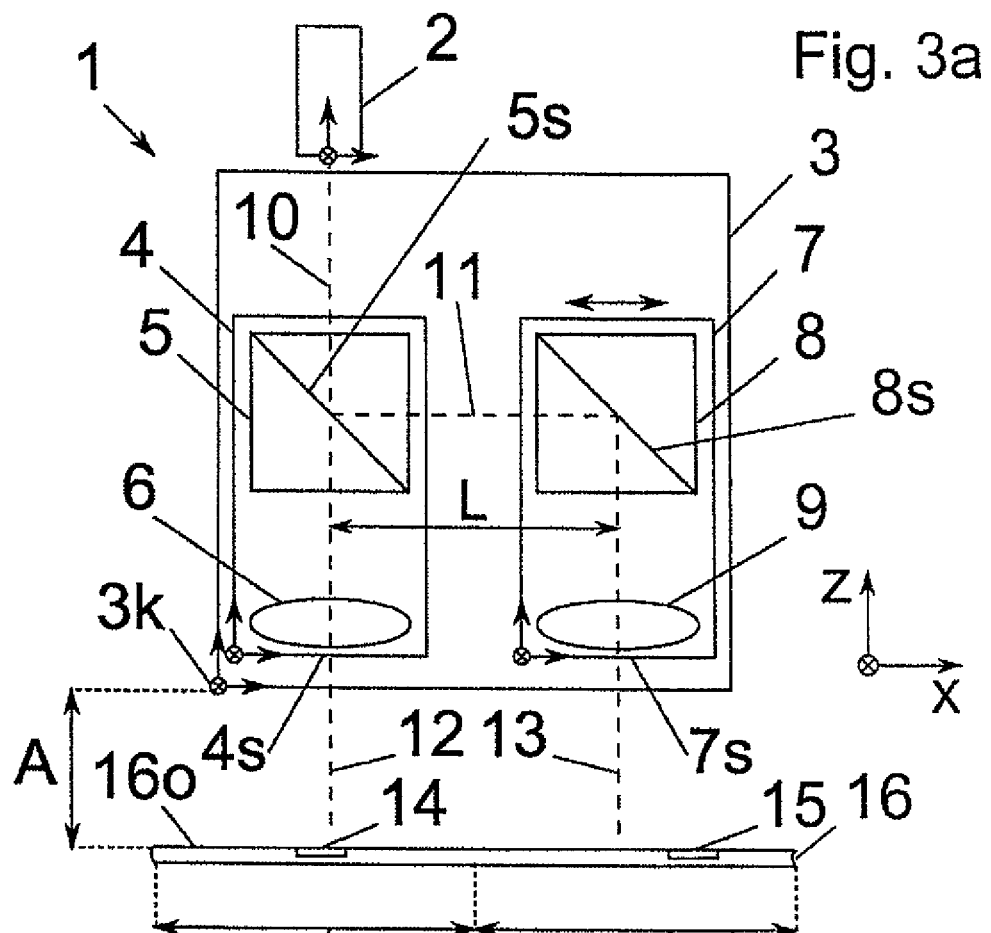
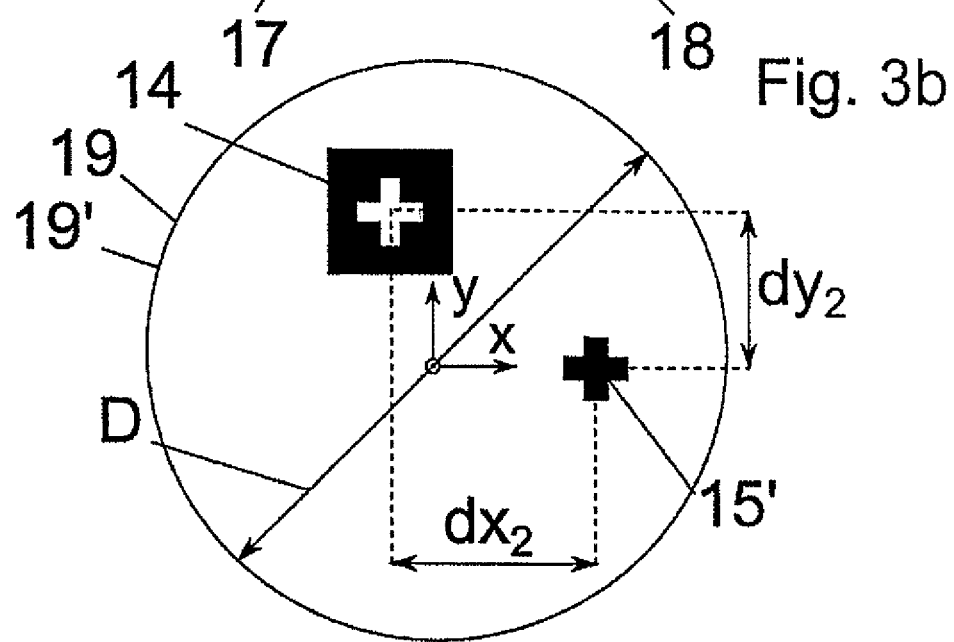

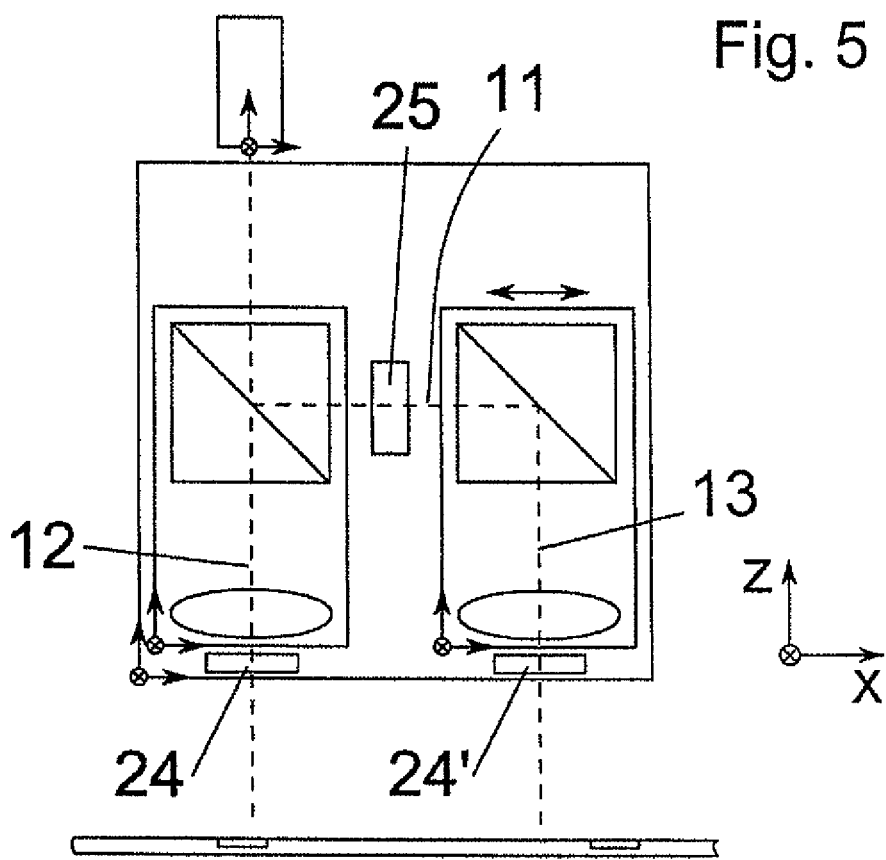
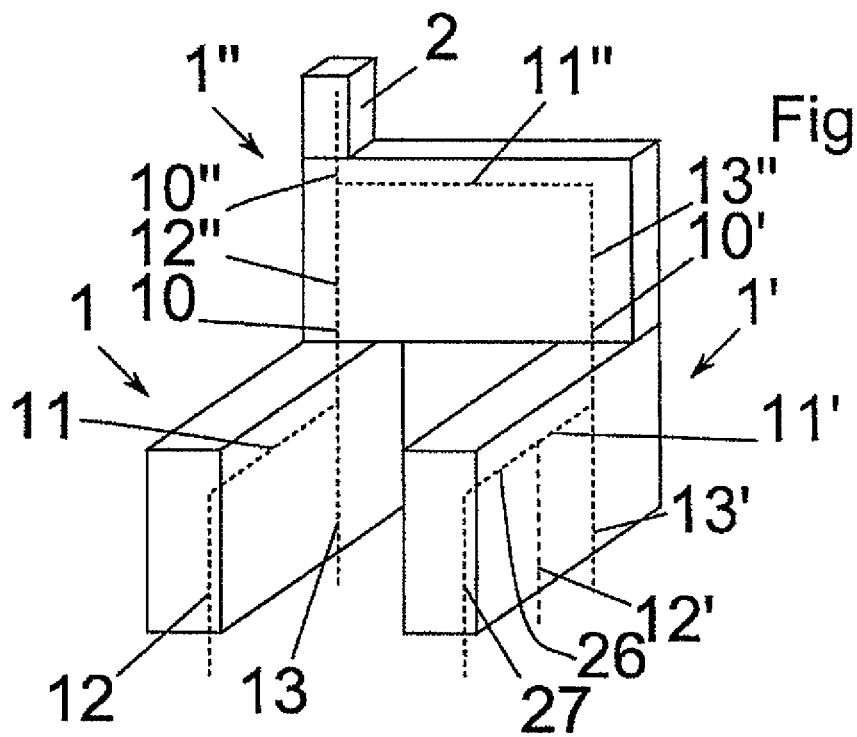

MEASURING FORM CHANGES OF A SUBSTRATE

FIELD OF THE INVENTION

This invention relates to a device for determining changes in shape of a substrate parallel to its substrate surface and a corresponding method.

BACKGROUND OF THE INVENTION

Due to the ever advancing miniaturization in the semiconductor industry, no longer is only the alignment of the wafers to one another critical, especially with respect to the 3D technology which has become more and more important, but also the changes in shape which occur due to treatment of the wafers, especially parallel to the wafer surface.

Mainly in bonding technology are alignment precision and thus bonding precision as high as possible critical due to the structures which are becoming continually smaller. The problem of exact alignment of two structures prior to the bonding process to one another has already been successfully solved by different techniques. But it has been shown that during the bonding process distortions of the touching structures to one another can also occur. Furthermore, structures based on other physical parameters can be shifted relative to one another after a bonding process has already been carried out. Due to these shifts or distortions, a repeated or intensified deviation of the previously very good alignment precision occurs, especially after an already completed bonding process. Existing prior art encompasses mainly measurement devices which traverse two surfaces with respect to a coordinate system defined in a fixed manner, note the positions of the structures on the surface, and after the corresponding bond process repeat the measurement in order to obtain information about the distortions.

The measurement of individual structures on the substrate surface before and after treatment of the substrate is very complex and is associated with corresponding costs.

An advantage of this invention is a device and a method for determining changes in the shape of a substrate parallel to its substrate surface, wherein the determination takes place promptly, with high precision, reliably and economically.

This advantage is achieved with the features of the claimed subject matter. Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

SUMMARY OF THE INVENTION

The basic idea of this invention is to determine, with a mechanical-optical measurement system, the relative shift of two (or more) structures on a substrate surface to one another (distance $dx_n/dy_n$) by means of optics as claimed in the invention (for imaging of two or more structures distributed on a substrate surface) and a detection means for detecting the imaged structures which are located in two different fields of view of two (or more) optics apparatus of the optics. This invention thus abandons an absolute or fixed reference system for measuring the relative shift (distance $dx_n/dy_n$), so that upon the repeated measurement for ascertaining changes in shape again the relative position between the two (or more) structures which are to be detected is determined in order to be able to determine the relative shift of the two (or more) structures which has been caused especially by the working of the substrate or to deduce the change in the shape of the substrate. Therefore the embodiment as claimed in the invention records the surfaces of n different or two different positions at the same time generally by n-optics apparatus, in particular by only two optics apparatus. The recording is a superposition of all n-images or two images. The recording takes place especially by CCD detectors, analog cameras, etc.

Detection marks, but also embossed structures or parts thereof, are conceivable as structures as claimed in the invention. For embossed structures, parts of the embossing structures which have been embossed in the step and repeat method or the respective embossing structure or several embossing structures in combination are conceivable.

A distance A between the optics or the optics apparatus (especially their lenses) and the surface of the substrate which is to be measured depends on the properties of the lens(es) used. The distance is known to one skilled in the art under the term "working distance". The embodiment as claimed in the invention has a working distance in the micron range. Other dimensions are likewise possible. The "depth of focus" (DOF) variation is roughly 5-50 µm. At a 20-fold enlargement stage the DOF variation should be less than 10 µm, at a 10-fold enlargement stage the DOF variation should be less than 20 µm, and at a 5-fold enlargement stage the DOF variation should be less than 50 µm.

The terms "actual distance" (distance B) and "virtual distance" (distance $dx_n/dy_n$) are defined below. According to the invention, the actual distance is defined as the real distance between two structures, i.e., as it would be determined by any other measurement method. The virtual distance is defined as the distance $(dx_n/dy_n)$ between two structures in the detection field (camera space). The virtual distance is dependent on the X-Y positions of the two (or more) optics apparatus to one another, but independently of the X-Y positions of the optics apparatus to the substrate to be measured (sample coordinate system, see below). Thus, the detection field as claimed in the invention is not necessarily covered with a structure field which has at least one structure. A structure field can be, by way of example and not limitation, an embossing structure which has been applied in the step and repeat method. There can be several detection fields for each structure field and vice versa.

The embodiment as claimed in the invention is used in most cases for a before/after measurement. The use of the optics as claimed in the invention is just as important for a determination of the relative distances of surface structures in an individual, especially simultaneous measurement process in order to obtain statistical information about the relative distances of the structures on this one surface. In this way, before a possible bond process statistical information about the distances between structures is obtained. Third, an in-situ measurement during the deformation of the surface, therefore for example during a bond process, is conceivable.

As claimed in the invention there are several noteworthy coordinate systems. The optics coordinate system referenced to the optics, the sample coordinate system which is associated with the substrate to be measured or which is fixed to the substrate or the substrate chuck, and the laboratory coordinate system in which the device as claimed in the invention is located.

According to one embodiment of the invention, it is contemplated to compute the tool-induced shift (TIS). The TIS is known to one skilled in the art. It is a deviation of a structure from the ideal, expected location as a result of tool and optics faults. For example the optical axis or the optical axes need not always be normal to the surface which is to be measured. In order to compute how large the error of the optical axis is relative to the substrate surface, the X-Y position of the structures is determined as claimed in the invention in a rotational position of 0°, Afterwards the entire system is turned by 180° and the X-Y position of the structure on the surface is determined again. The TIS is the arithmetic mean of the X-Y positions of any two structures determined at 0° and 180°. The TIS in the ideal case need be determined only once per device. In practice the TIS computation is done after changing each wafer (substrate). The TIS value is dependent on topography. The higher the topography, the greater the TIS becomes. These dependencies and the resulting technical problems are likewise known to one skilled in the art.

A device according to the invention is suited especially for determining the relative shift or the "virtual distance" of two (or more) distant points on a wafer by means of several optics apparatus which are rigidly joined to one another without the aid of a fixed reference system. If an actual distance B in the X- and/or Y-direction is to be determined in addition to or instead of a shift, the optics can be calibrated beforehand with a calibration wafer. On the calibration wafer, there are several marks structures, but at least two marks, of which the distance to one another is known with high precision. These wafers can be produced for example by methods with high local resolution, for example an electron beam writing method.

The optics apparatus are aligned using these two marks and are fixed in their position. Afterwards the execution can exactly measure points which are located at similar distances by picture superposition. It is decisive that the optics apparatus of the optics after calibration and/or between measurements on the same substrate no longer shift to one another. By means of the calibration wafer, the embodiment as claimed in the invention can be used to determine a rotation error between sample holder and optics. To do this two (for n-fold optics accordingly n) measurement points with an exactly known distance are focused. The optics apparatus are advantageously located concentrically around the axis of rotation of the sample holder or linearly to one anther. For n-optics apparatus the angle between two optics apparatus at a time is 360/n degrees. Then, a recording (detection) of n-structures takes place in the rotary position 0 degrees. Afterwards the wafer is turned by 360/n degrees. A further recording is made. Thus, in the optimum case there are n recordings. The oblique position of the sample holder surface can be determined from the n recordings.

It should be explicitly emphasized again that for determination of distortion by a before/after comparison, calibration of the optics is not necessary. The combination of the two methods is likewise disclosed herewith.

From the disclosed possibilities, using vector computation and/or statistical methods all necessary information can be computed and/or determined about positions, distortion and shifts of structures on substrate surfaces (therefore especially in the X and/or Y direction, preferably of one substrate surface plane), before, during and after any process, in particular a bond process.

All data which have been obtained prior to a bonding process, can be transmitted to a second device, for example a bonder, especially via a data line and a corresponding frequency band. Preferably this, transfer of data can take place within an in-line process chain in which several devices with different tasks are designed to treat a wafer system in sequence.

Changes in shape can be strains and/or distortions which occur along the substrate surface, and which for example have been caused by heat treatment of the wafer, especially on an apparatus which is separate from the device as claimed in the invention. The changes in shape which are relevant are less than 1000 nm, especially less than 500 nm, still better less than 200 nm, preferably less than 100 nm, even more preferably less than 50 nm.

The method is used preferably, but not in a limiting manner only, in wafers which have not yet been back-thinned. These wafers have normalized standard thicknesses. Substrate are therefore for example wafers with a thickness of less than 1000 µm, preferably less than 800 µm, still more preferably 725 µm. Typical diameters of wafers are 200 mm, 300 mm or 450 mm. The method, strictly speaking, is independent of the wafer thickness. By the optics as claimed in the invention being used in any case mainly for thicker wafers which have not yet been back-thinned, wafers which are bonded poorly to one another can be again separated from one another in a later rework process. The separation, i.e., the "rework", of wafers which have been poorly bonded to one another is especially feasible prior to a heat treatment step which takes place later. After such a step, generally a strong permanent connection is produced between the two wafers such that they can no longer be separated from one another with any method. The claimed invention is not limited to a certain wafer material. Therefore all types of wafers from the most varied materials can be used. In the semiconductor industry mainly wafers of semiconductor materials are used. Materials from ceramics, metals or plastics are also conceivable, such as in particular:
Si, Ge, GeAs, MP, etc. . . .
Cu, Au, Ag, Ti, Cr, etc. . . .
polymers
ceramics
composite materials In particular, alignment markings, electronic components on the wafer, dices, IC structures and edges are possible as structures according to the invention. Here the structures are made differently, even more preferably complementary to one another.

According to the invention, the detection apparatus for detecting the distance can detect and assign the positions of the aforementioned structures relative to one another, after focusing of the respective optics apparatus on the corresponding structure.

Components of the optics apparatus can be prisms, mirrors (deflection means) and/or lenses. Advantageously, the prisms are made as reflection prisms and/or polarization prisms. The lenses have a magnification factor greater than 1, especially greater than 2, preferably greater than 5, still more preferably greater than 10, even more preferably greater than 100, most preferably greater than 1000. The lenses are made such that a distance as small as possible between the lenses of the respective optics apparatus and the respective substrate or the respective structure to be detected can be implemented. To the extent beam paths are addressed, beam path segments are also contemplated according to the invention. Mirrors are used for deflection/alignment of beam paths. The position and/or alignment of the aforementioned components of the optics can be fixed within the optics (therefore relative to the optics coordinate system).

According to another aspect of the invention, by superposition or combination of the beam paths of the two optics apparatus a real distance between the structures is not necessarily measured, but an imaginary distance or one which has been projected by the optics apparatus, since only the exact determination of the change in the distance is what is important.

According to one advantageous embodiment of the invention, it is provided that the device has calibration means for calibration of the first and the second optics apparatus (or several optics apparatus) relative to one another. Thus the device can be adjusted to different substrates and structure distances.

If the first and/or the second beam path (or accordingly several beam paths) is/are made adjustable, the device according to the invention can be used more flexibly, especially for different substrates or substrate types with different structures on the substrates. In this respect, it is advantageous if the beam path is adjusted by adjustment of lenses of the respective optics apparatus, especially of one single lens per optics apparatus. According to the invention, there are preferably 6 degrees of freedom, 3 degrees of freedom of translation and 3 degrees of freedom of rotation.

It is especially advantageous if the first and the second beam path are made able to be fixed relative to one another since, especially between two measurements of the distances of the first and second structures, adjustment is not possible so that the accuracy in determination of the change in the distance is as great as possible.

According to another aspect of this invention, it is provided in one advantageous embodiment that there is a vibration-damped and/or thermally insulated chucking apparatus for holding and jointly moving of the first and second (or other) optics apparatus relative to the substrate. In this way the optics apparatus remain movable in spite of fixing which has taken place relative to one another (therefore in the optics coordinate system).

It is furthermore advantageous that the detection apparatus has a single, digital camera with which the first and second structure can be detected via the first and second optics apparatus, especially jointly, preferably at the same time. The detection apparatus acquires a digital or digitized value for the position of the first and for the position of the second structure and determines from it a distance between the two structures, separately in the X direction and in the Y direction, therefore a $dx_1$ and a $dy_1$.

To the extent the first and second beam path can be aligned in particular by deflection means of the first and/or second optics apparatus such that they run together for detection of the distance by the detection means, a simultaneous detection of the first and second structure is possible with maximum possible resolution in spite of the large distance between the two structures (therefore greater than the detection region of each individual optics apparatus).

According to another advantageous embodiment of the invention it is provided that a plurality of distances of detection pairs distributed along the substrate surface (each with first and second structures) can be detected and can be assigned to the respective detection pair by the device. In this way not only can individual changes in shape on the substrate be ascertained, but maps of the change in shape in the form of change vectors, therefore stress and/or strain maps for the respective substrate can be determined which can be used for further processing of the substrate.

The materials of the parts of the embodiment as claimed in the invention are as invulnerable as possible to thermal stress. In particular, they have a coefficient of thermal expansion near zero, in the best case a coefficient of thermal expansion of zero. In this connection the use of Invar™ alloy should be mentioned.

The possible applications of the optics as claimed in the invention are many. The measurement of the structures of a surface before and after the bond process is conceivable. In doing so, the optics of the invention is combined with a source whose electromagnet radiation can penetrate the wafer which is to be examined. By measuring structures before and after bonding, in the optimum case the measurement of two structures during the bond process, therefore in-situ, the shift of the structures to one another, therefore the distortion, can be measured. The reason for this measurement is the alignment accuracy which is required, and more and more compelled, in the semiconductor industry. This becomes more important, the smaller the structures which are to be bonded to one another. If it is ascertained after one such bond process that the distortions are too large, the wafers can be separated from one another again and re-used.

According to one advantageous embodiment, between the substrate surface and the optics apparatus (or more than one apparatus) a liquid fluid can be introduced for changing the index of refraction during detection.

Various filters can be installed in all optical paths. In one preferred version, half-shadow filters and/or polarization filters are used. Furthermore filters can be installed for complete interruption of the optical path in order to obtain easier identification of the structures in the picture space (or in the superimposed picture in the detection apparatus) by sequentially turning on and off individual beam paths. All other filters which are known to one skilled in the art and which have suitable properties are also contemplated.

To the extent hardware features imply or describe method features, they are to be considered disclosed according to the method and vice versa.

Other advantages, features and details of this invention will become apparent from the following description of figures and the claims and the pertinent figures.

BRIEF DESCRIPTION OF THE DRAWINGS

FIG. 3a shows a schematic cross sectional view of a device as claimed in the invention in the detection of a second distance between the image of the first structure and the image of the second structure after one treatment step, FIG. 3b shows a schematic view of an image detected by the detection apparatus (with the images according to FIG. 3a) for evaluation and determination of distances of the images according to FIG. 3a, FIG. 4a shows a schematic cross sectional view of a second embodiment of the invention with three optics apparatus, FIG. 6 shows a schematic perspective view of a fourth embodiment of the invention with optics connected in succession.

DETAILED DESCRIPTION OF PREFERRED EMBODIMENTS

The same components or components with the same action are identified with the same reference numbers in the figures.

Figure 1A:
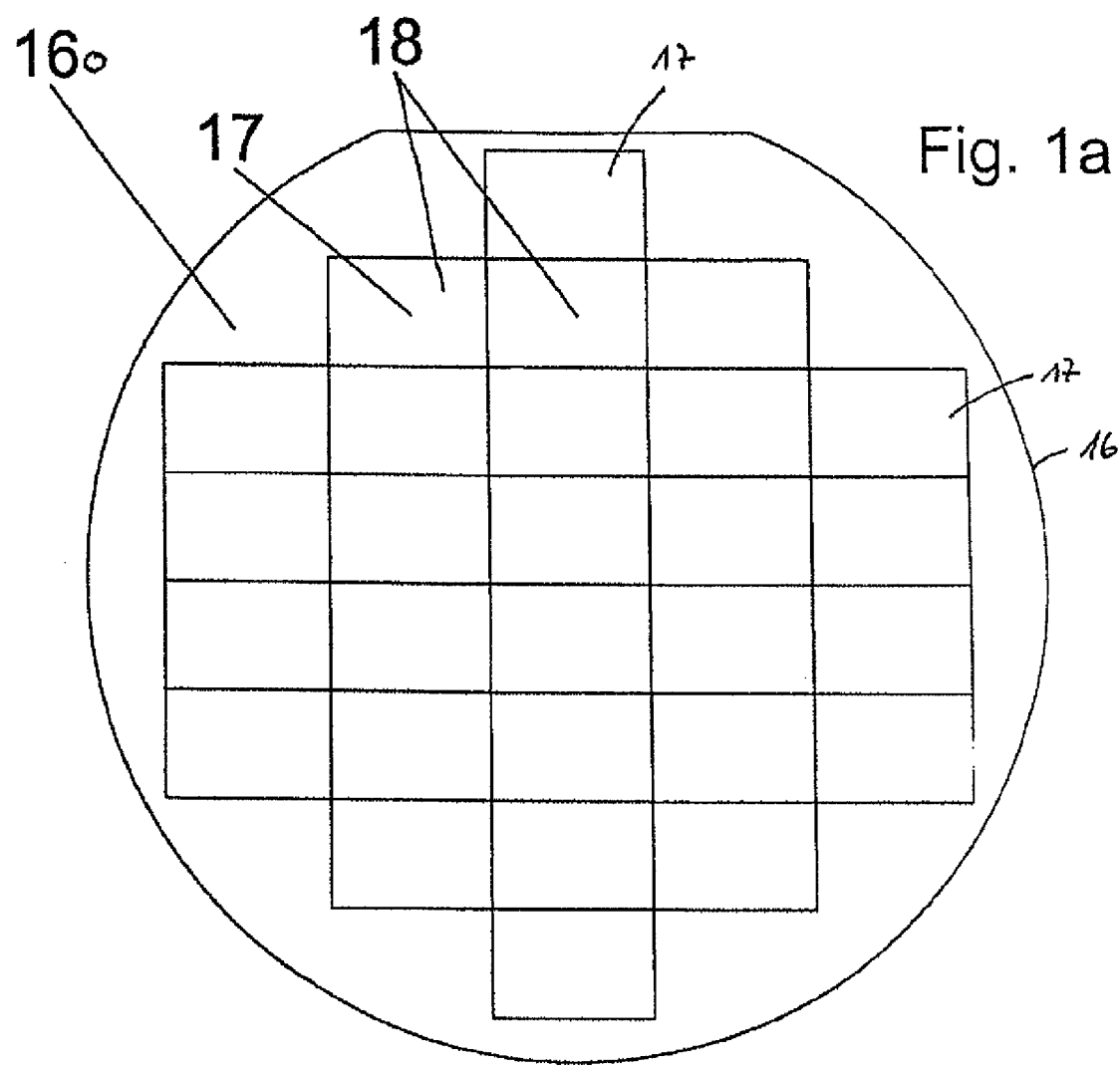
FIG. 1a shows a plan view of a substrate with detection fields.
Figure 1B:
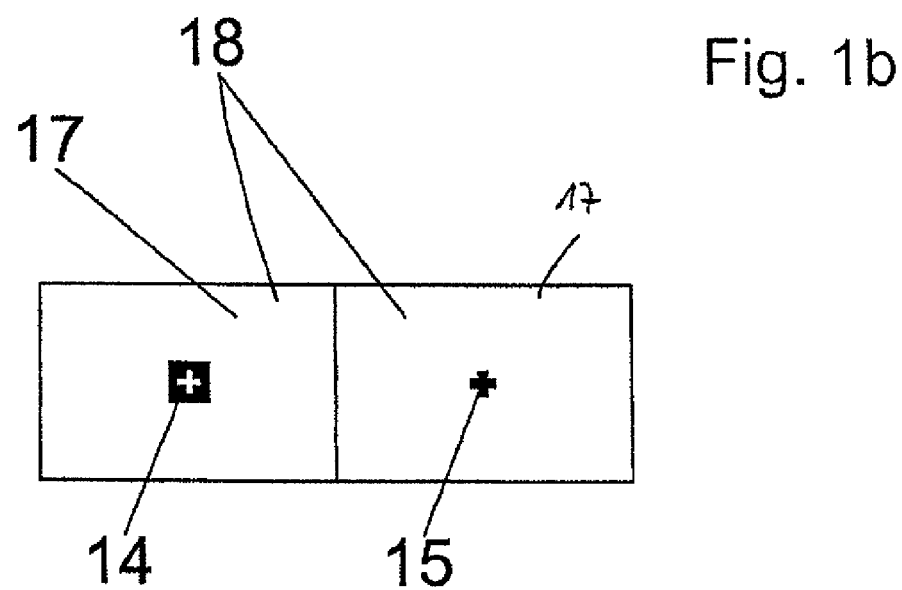
FIG. 1b shows a detail view of a detection pair consisting of two detection fields with structures.

FIG. 1a shows a plan view of a substrate surface 16o of a substrate 16 with a plurality of detection fields 17, two detection fields 17 forming one detection pair 18. Detection pairs 18 can be any two (or more) detection fields 17, but preferably adjacent detection fields 17. On each detection field 17 of the detection pair 18 according to FIG. 1b there is at least one structure 14, 15 at a time. On the left detection field 17 according to FIG. 1b there is a first structure 14 and on the right there is a second structure 15. The first structure 14 is shown differently, i.e., complementarily, to the second structure 15 so that differentiation/identification of the structures 14, 15 is more easily possible. The structures 14, 15 can however also have the same shape and/or size, therefore can be congruent.

The more detection fields 17 or detection pairs 18 with one or more structures 14, 15 are distributed on a substrate surface 16o of the substrate 16, the more accurately changes in the shape of the substrate along or parallel to the substrate surface 16o can be ascertained.

The detection fields 17 could be edicing sheets, and reference marks of the dicing sheets would be used at the same time as structures 14, 15. They are regions which are separated from one another in a later back-end process by separating means.

The schematic representation in the figures is not to scale, so that the function of components of the device of the invention can be more easily grasped. For this reason, for the description of the invention, less relevant or irrelevant components or components whose function is known are not shown in the figures. Thus, for example a substrate chuck is not shown since known substrate chucks can be accessed here. Furthermore no frame or housing for the device is shown since known frames can also be accessed here, especially in concert with a robot arm for holding and positioning of optics 1 with a chucking apparatus 3 for holding and jointly moving a first optics apparatus 4 and a second optics apparatus 7 relative to the substrate 16, especially parallel to the substrate surface 16o. The chucking apparatus 3 can include in particular a robot arm.

The first optics apparatus 4 is equipped with a lens 6 and a prism 5. The lens 6 is able to be aligned in direction, and with one face side 4s, almost (distance A) to the first structure 14 so that the detection field 17 which contains the first structure 14 can be detected at least partially from one beam path 12 of the first optics apparatus 4 in its detection region 19 (field of view). The beam path 12 runs through the lens 6 which is made especially as a collecting lens and which is used for enlargement and parallelization of the nonparallel light waves which are incident on the lens 6 from the substrate surface 16o.

The first optics apparatus 4 can be focused on the first structure 14 by a control apparatus of the device which is not shown.

The prism 5 and/or 8 can be a glass prism which is preferably at least partially amorphous, even more preferably on its oblique surface 5s and/or 8s. It allows at least partial reflection of light waves which have been reflected by the structures 14, 15 and which have been generated by a light source on its oblique surface 5s, 8s. In this way the light waves (beam path 13) reflected by the structure 15 are first deflected on the oblique surface 8s into the beam path 11 (by at least partial reflection). The light waves of the beam path 11 are deflected/reflected at least partially to the beam path 10 on the oblique surface 5s.

The light source can be located in the detection apparatus 2, or under the substrate which is to be measured. In the second case, the light is therefore emitted laterally. In the third case, the substrate to be measured must be transparent in the corresponding wavelength range of the light source.

At the same time, the light waves which have been reflected by the structure 14 (beam path 12) on the oblique surface 5s (reflection surface) pass into the beam path 10, deflection as small as possible, preferably no deflection, taking place.

Thus, the first optics apparatus 4 forms the field of view which encompasses the structure 14 on the detection apparatus 2, the structure 14 being detectable as an image 14' by the detection apparatus 2.

The light source (not shown) can be made as a reflection light source, especially generating scattered light. Alternatively there can also be a light source which transmits through the substrate 16. The light source can be assigned to the camera (detection apparatus 2).

The second optics apparatus 7, analogously to the first optics apparatus 4, is provided with a prism 8 and a lens 9. A beam path 13 of the second optics apparatus 7 can be arranged such that the second structure 15 or the detection field 17, which has the second structure 15 or a detection region (field of view) hereof, can be detected.

The prism 8 which is provided in the second optics apparatus 7 deflects the beam path 13 into a deflected beam path 11 in the direction of the prism 5 of the first optics apparatus where the beam path 11 is combined with the beam path 12 into a common beam path 10 and is incident on a detection apparatus 2 in the form of a preferably digital camera with a high resolution picture sensor. The detection apparatus 2 acquires a picture which is shown in FIG. 2b and which at the same time contains the enlarged image 14' of the first structure 14 and a correspondingly enlarged image 15' of the second structure 15.

Figure 2A:
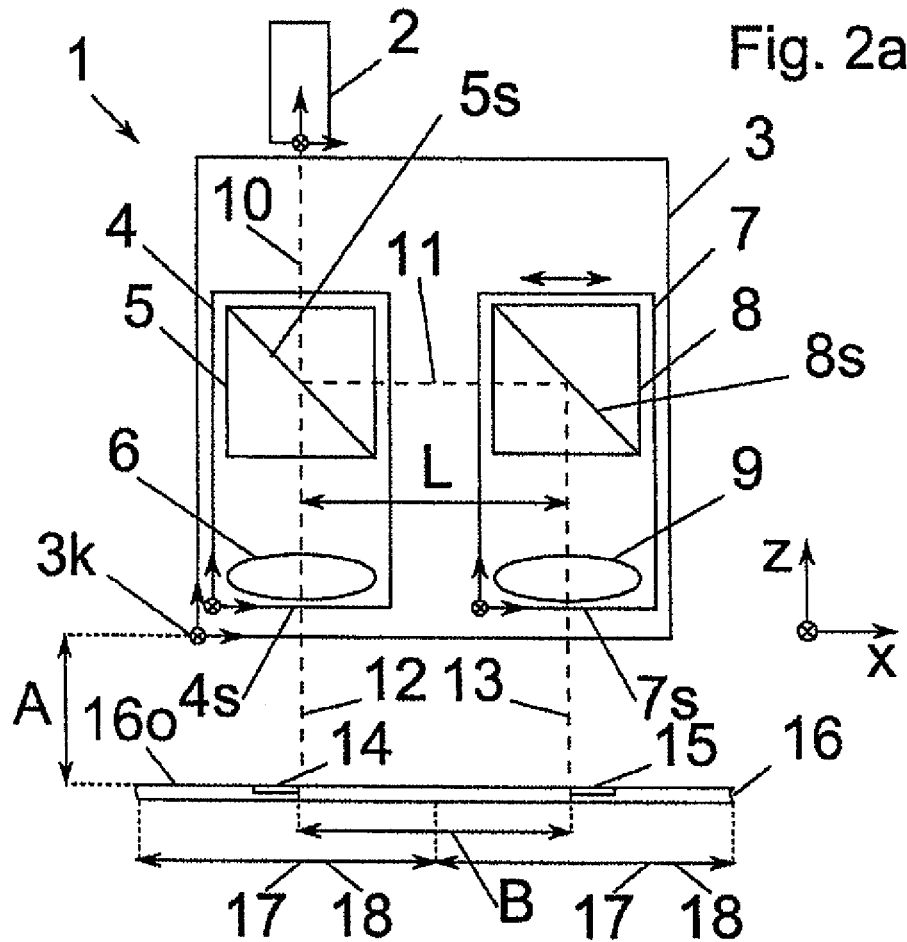
FIG. 2a shows a schematic cross sectional view of a device as claimed in the invention in the detection of a first distance between an image of a first structure and an image of a second structure.

The prism 8 in FIG. 2a can also be replaced by a mirror since a further transmitted beam path is not required in the embodiment shown there.

An alignment of the first optics apparatus 4 to the first structure 14 and an alignment of the second optics apparatus 7 to the second structure 15 are necessary only to the extent that the structures 14, 15 are completely detected by the respective optics apparatus 4, 7 (in the detection region or field of view). The alignment takes place preferably by moving the substrate 16 (or the substrate chuck which holds the substrate 16) while the optics apparatus 4, 7 are fixed during alignment. It is contemplated according to the invention to divide the alignment of the different directions (X, Y, Z and optionally rotation) between the optics apparatus 4, 7 and the substrate chuck. An exact alignment of the optics apparatus 4, 7 relative to the structures 14, 15 for ascertaining the absolute position of the structures 14, 15 can be omitted, in which one important advantage of this invention consists.

Figure 2B:
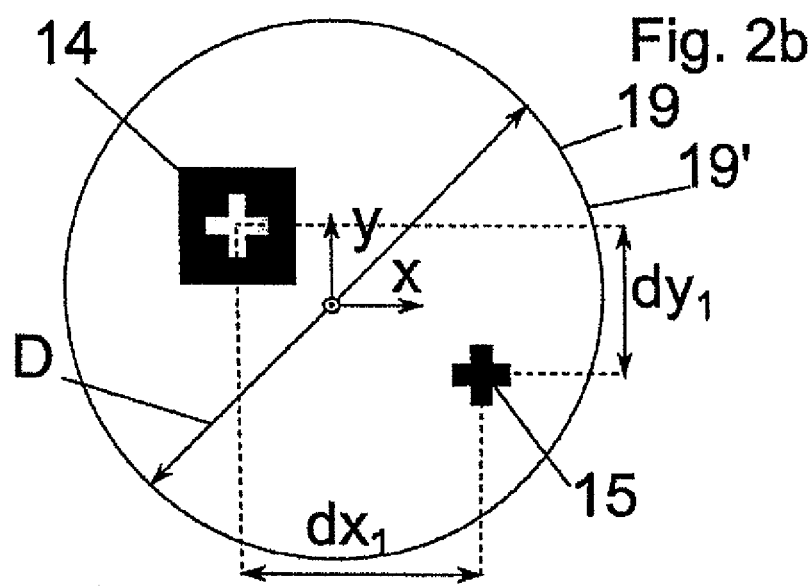
FIG. 2b shows a schematic view of an image detected by the detection apparatus (with the images according to FIG. 2a) for evaluation and determination of distances of the images according to FIG. 2a in a first embodiment of the invention.

The superimposed picture of the two detection regions of the optics apparatus 4 and 7, which picture has been acquired by the detection apparatus 2, can be evaluated with images 14', 15' according to FIG. 2*b* such that a distance $dx_1$ of the image 14' of the first structure 14 to the image 15' of the second structure 15 can be determined in one X direction. Likewise a distance $dy_1$ in one Y direction which runs orthogonally to the X direction (both parallel to the substrate surface 16*o*) can be determined. The distances $dx_1$ and $dy_1$ generally do not correspond to the actual distances of the structures 14, 15 on the substrate surface 16*o*.

Optionally, the actual distance 13 between the structures 14, 15 can be computed via a prior calibration of the first and second optics apparatus 4, 7 to one another by the optical parameters, the length L of the deflected beam path 11, being determined. The length L is preferably three times, more preferably five times, still more preferably ten times, most preferably fifteen times larger than the length and/or width of the field of view region.

To the extent in the Y direction the beam paths 12, 13 are not deflected and the beam path 13 has been calibrated or aligned exactly parallel, the distance $dy_1$, aside from a possible enlargement by the lens 9, corresponds to the actual distance or offset of the structures 14, 15 in the Y direction. But due to the relative determination of the distance $dx_n$, $dy_n$ this is not necessary, so that the alignment of the optics apparatus 4, 7 need take place as claimed in the invention only roughly in order to be able to have and focus (for detection) the structures within the detection space of the optics apparatus 4, 7.

For calibration or adjustment of the optics apparatus 4, 7, at least the second optics apparatus 7 can be moved in the X and Y direction so that the optics apparatus 4, 7 can be positioned relative to one another such that the structures 14, 15 are in the respective beam path 12, 13 and can be detected. The second optics apparatus 7 is moved relative to the chucking apparatus 3, while the first optics apparatus 4 is fixed relative to the chucking apparatus 3. The first optics apparatus 4 can be moved by moving the chucking apparatus 3 in the X and Y direction until the first structure 14 is detected from the beam path 12 and lies in the detection region 19 of the first optics apparatus 4. Then the second optics apparatus 7 is moved as described above until the second structure 15 is located in the beam path 13 and a corresponding detection region 19' (field of view).

A movement in the Z direction takes place by moving the chucking apparatus 3 for adjusting an as small as possible, i.e., standard (flush alignment of the face side 4*s* with a face side 7*s* of the second optics apparatus 7) distance of the optics apparatus 4, 7 to the structures 14, 15 in the detection of the structures 14, 15. The movement in the z direction is used to adjust the focus and/or the working distance which is known to one skilled in the art in the field.

The actuation of the optics apparatus 4, 7, of the detection apparatus 2 and of the chucking apparatus 3 or of the substrate chuck takes place via drive means (not shown), controlled by the control apparatus.

The second optics apparatus 7 can be fixed relative to the first optics apparatus 4 as soon as the above described positions have been reached.

The lenses 6, 9 of the first and second optics apparatus 4, 7 are preferably provided with six degrees of freedom in order to enable a focusing and exact adjustment/calibration of the beam paths 12, 13 in the direction of the prisms 5, 8.

The beam paths 12, 13 preferably run parallel to one another and orthogonally to the substrate surface 16*o* up to the prisms 5, 8. While the beam path 12 passes through the prism 5 (without changing direction) into the beam path 10, the beam path 13 undergoes a change of direction in the direction of the beam path 12 in the form of the beam path 11 which has been deflected by the prism 8 (or mirror). The deflection takes place preferably orthogonally to the beam path 13.

The deflected beam path 11 in the region of the emergence of the beam path 12 from the prism 5 or the transition of the beam path 12 to the beam path 10 is incident on the prism 5 and is deflected there such that the beam path 11 converges with the beam path 12 into the beam path 10 in the direction of the detection apparatus 2. The beam path 10 is preferably orthogonal to the beam path 11.

In this way, the structure 14 and the structure 15 can be combined into a superimposed picture on the detection apparatus 2 and evaluated. Evaluation takes place by a control apparatus which is integrated especially into the detection apparatus 2 or in a control apparatus which is logically connected to the detection apparatus.

Accordingly, a plurality of detection pairs 18 can be detected along the substrate surface 16*o* and the respective relative distances of the corresponding first and second structures 14, 15 to the respective detection pairs and their position on the substrate surface 16*o* are stored.

Then, the substrate 16 can pass through one or more treatment steps which possibly lead to a change in the shape of the substrate 16, especially in the X and Y direction. In this case there are strains/distortions.

In the method step which is shown in FIGS. 3*a* and 3*b*, according to the above described detection of the distances $dx_1$ and $dy_1$ the possibly altered distances $dx_2$ and $dy_2$ of the stored detection pairs 18 are determined. Here, it is not critically necessary that the first optics apparatus 4 or the second optics apparatus 7 relative to the first structure 14 or the second structure 15 are again positioned identically. What is important is only that the structures 14, 15 can be detected by the optics apparatus 4, 7 in the respective detection region 19, 19' (field of view). It is moreover decisive that the optics apparatus 4, 7 assume the same position to one another and the beam paths 12, 13, 11 and 10 run identically as in the first detection according to FIGS. 2*a* and 2*b* for detecting the distances $dx_1$, $dy_1$.

After detection of the distance $dx_2$, $dy_2$, the respective change can be computed in the X direction ($\delta x = dx_2 - dx_1$) and in the Y direction ($\delta y = dy_2 - dy_1$) and changes in the shape of the substrate 16 along the substrate surface 16*o* can be deduced from the computed vectors. Therefrom, by determining several changes in distance on several detection pairs 18, a map of the change in shape or strain map and/or distortion map of the respective substrate 16 can be prepared. It can be used for further treatment of the substrate 16, especially for exact positioning and alignment of the substrate 16 relative to another substrate surface. Thus the yield can be greatly increased.

The structures 14, 15 are preferably located at the focus of the optics apparatus 4, 7, especially the lenses 6, 9. The device according to the invention can be operated with optical light, infrared radiation or X-radiation in the reflection or transmission mode, limited only by the reflection and/or transmission properties of the substrate material used. The corresponding detectors and/or light sources which are used with the optics 1 can therefore be located on the same side or on the respectively opposite side of the system to be measured. When using infrared radiation, its wavelength is preferably greater than 1000 nm, more preferably greater than 1050 nm, most preferably greater than 1700 nm and especially smaller than 10 μm. In one special embodiment the optics can be part of a conformal microscope, in particular of a confocal laser raster microscope. Lasers can be used as light sources for special applications.

The distance A of the chucking apparatus 3 or of the optics apparatus 4, 7 from the face sides 4s, 7s to the substrate surface 16o in the detection of the structures 14, 15 is preferably smaller than the actual distance B between the structures 14, 15. Furthermore the distance A is smaller than the length L of the deflected beam path 11.

Figure 4A:
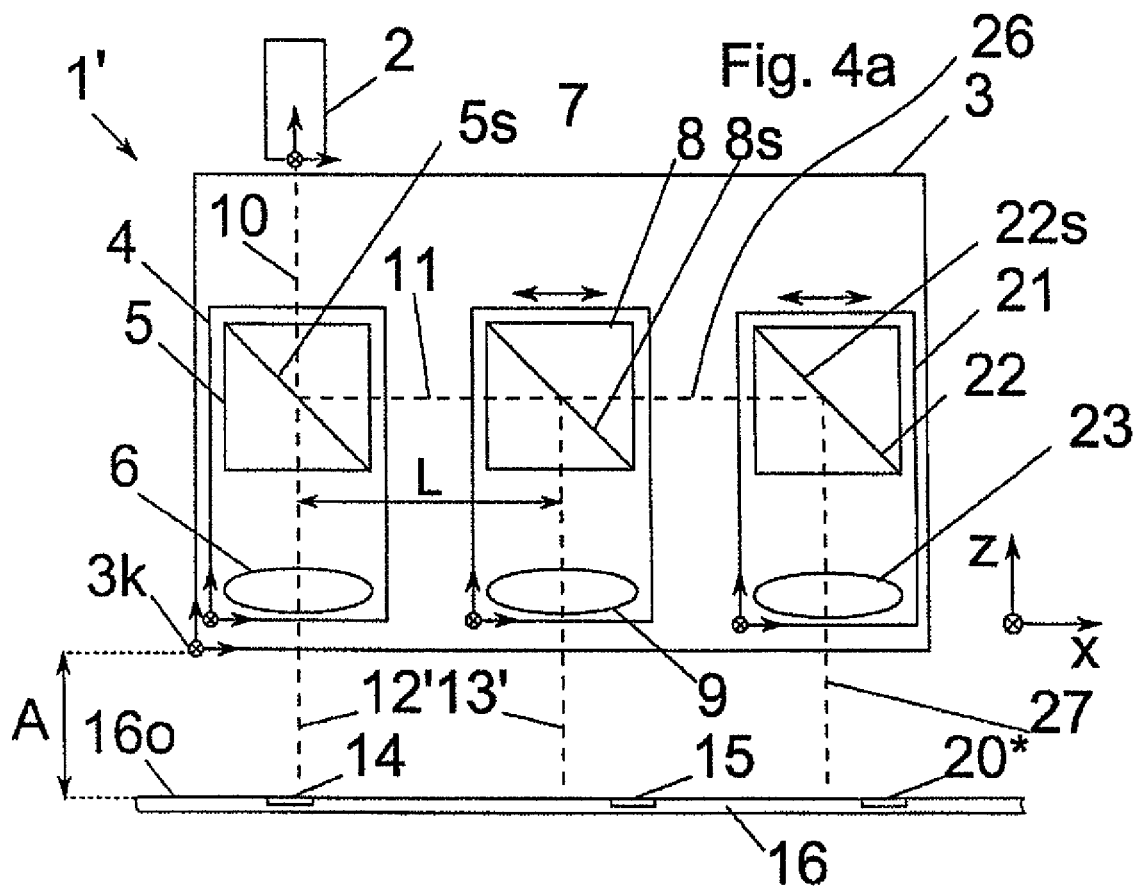
FIG. 4b shows a schematic view of a picture detected by the detection apparatus (with the images according to FIG. 4a) for evaluation and determination of distances of the images according to FIG. 4a, FIG. 5 shows a schematic cross sectional view of a third embodiment of the invention with two optics apparatus and filter apparatus
Figure 4B:
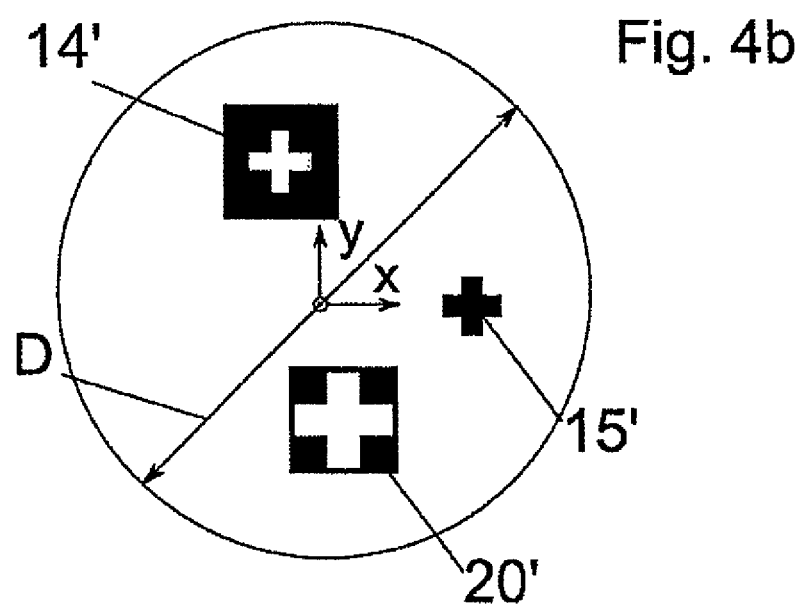

In another embodiment of the invention, as shown in FIGS. 4a and 4b the optics 1' comprises more than two (here: three) optics apparatus 4, 7, 21. In one step, several images of 14', 15', 20' structures 14, 14, 20 which have been produced by the optics 1' can be simultaneously detected in the detection apparatus 2 and their distances or changes in distance can be determined more promptly.

The function of the third optics apparatus 21 with a lens 23 and a prism 22 (or mirror) with an oblique surface 22s for deflection of a beam path 27 into one beam path 26 is analogous to the second optics apparatus 7 which is described above for FIGS. 3a, 3b, 4a, 4b, the beam path 26 coinciding at least partially with the beam path 11 after it has at least partially passed through the oblique surface 8s of the prism 8.

Thus the picture shown in FIG. 4b is formed in the detection apparatus 2 in which the images 14', 15' and 20' are detected and the distances and/or the change in the distances between the images 14', 15' and 20' are determined therefrom especially by the control apparatus.

In another embodiment (which is not shown), the beam path 10 of the (in this case central) optics apparatus 4 passes preferably through the center of mass of the optics, the other optics apparatus of the optics being preferably located symmetrically around the central optics apparatus 4. By using this n-fold optics then a total of n locations could be analyzed at the same time. In this way, by before/after recording, corrections with respect to the rotational imprecision of the sample holder with reference to the optics can be determined and computed. Accordingly it is possible by corresponding correction measures to enable a relative rotation between the optics and sample holder which is provided with an error which is as small as possible. The possibility of illuminating each optics individually, especially in systems with n-fold optics, is also disclosed.

The embodiment as claimed in the invention stores the superimposed pictures preferably digitally in order to digitally analyze and/or rework them (especially to increase the contrast). The use of digitally stored pictures, their evaluation, and conditioning for increasing the resolution by corresponding software algorithms is herewith likewise disclosed.

In another embodiment of the invention as shown in FIG. 5, which can be combined in particular with the above described embodiments, there are filters 24, 24', 25' for optimization of detection. They can be made as half-shadow and/or polarization filters. For example, to assign the images 14', 15' (and optionally 20') to the corresponding structure 14, 15 (and optionally 20) a filter 24, 24', 25 can be moved into the respective beam path 10, 11, 12, 13 (and optionally 26, 27). If the filter 14 is moved into the beam path 12 (or activated), in the picture of the detection apparatus 2 only the image 15 is visible. The image 14' is "swallowed" by the filter 14 and is only visible again when the filter 24 has been moved out of the beam path 12 (or deactivated). This applies analogously to the filter 24' or 25 for the beam paths 13 or 11.

In one special embodiment, several of the above described optics as claimed in the invention can be combined in a new embodiment by several optics 1, 1', 1" being connected in succession. Here the superimposed beam paths 10, 10' of the two lower optics 1, 1' are combined to one new output beam 12", 13" for the optics 1" (FIG. 6). It is built analogously to the optics 1, 1', and lenses (analogously lens 6, 9) can be abandoned. Thus, in the illustrated embodiment four different, especially adjacent detection regions 17 are detected and their structures 14, 15, 20 (and one other, not shown) are imaged onto the detection apparatus. The picture can be evaluated analogously to the aforementioned statements, optionally combined with filters according to FIG. 5.

More than two structures can be detected at the same time with this stacked "multiple optics".

REFERENCE NUMBER LIST 1, 1', 1" optics
2 detection apparatus
3 chucking apparatus
4 first optics apparatus
5 prism
5s oblique surface
5s oblique surface
6 lens
6s oblique surface
7 second optics apparatus
8 prism (or mirror)
8s oblique surface
9 lens
10, 10', 10" beam path
11, 11', 11" beam path
12, 12', 12" beam path
13, 13', 13" beam path
14 first structure
15 second structure
16 substrate
16o substrate surface
17 detection field
18 detection pair
19, 19' detection regions
20 other structure
21 other optics apparatus
22 prism (or mirror)
22s oblique surface
23 lens
24, 24' filter
25 filter
26 beam path
27 beam path
$dx_1$, $dy_1$ first distance
$dx_2$, $dy_2$ second distance
A distance
B distance
D diameter
L length

The invention claimed is:
1. A device for determining changes in a shape of a substrate by measuring the shape of the substrate before and after a process, the changes being parallel to a surface of the substrate, said device comprising:

optics comprising at least two optics apparatuses with at least two different beam paths, respectively, the optics apparatuses being configured to join together, and at least one detector configured, through the at least two optics apparatuses, to detect images of structures located on the substrate surface in the beam paths, respectively, and determine distances $dx_1$, $dy_1$, $dx_2$, $dy_2$ of the images of the structures and distances $dx_n$, $dy_n$ by superposition or combination of the beam paths, wherein $dx_1$ and $dy_1$ are respective distances in X and Y directions of the images of the structures before the substrate is subjected to the process, wherein $dx_2$ and $dy_2$ are respective distances in X and Y directions of the images of the structures after the substrate is subjected to the process, wherein $dx_n$ is a distance between $dx_1$ and $dx_2$, and wherein $dy_n$ is a distance between $dy_1$ and $dy_2$.

2. The device as claimed in claim 1, wherein at least one of the beam paths is made adjustable.

3. The device as claimed in claim 1, wherein the beam paths are made fixable relative to one another.

4. The device as claimed in claim 1, further comprising a vibration-damped and/or thermally insulated robot arm for holding and jointly moving the optics apparatuses relative to the substrate when the optics apparatuses are joined together.

5. The device as claimed in claim 1, wherein the detector is digital.

6. The device as claimed in claim 1, wherein mirrors of the optics apparatuses are configured to align the beam paths such that the beam paths converge for the imaging of the structures in the detector.

7. The device as claimed in claim 1, wherein the detector is configured to detect a plurality of distances of detection pairs of the structures that are distributed along the substrate surface, and wherein the distances are stored and assigned to the respective detection pairs.

8. The device as claimed in claim 1, wherein the optics apparatuses are arranged flush to one another and parallel to the substrate surface at least on one face side that faces the substrate surface.

9. The device as claimed in claim 1, wherein the changes in the shape of the substrate comprise strains and/or distortions along the substrate surface.

10. The device as claimed in claim 1, wherein the detector is further configured to respectively focus the optics apparatuses on corresponding ones of the structures prior to detecting the images.

11. A method for determining changes in a shape of a substrate, the changes being parallel to a surface of the substrate, the method comprising the following steps:

aligning optics comprising at least two optics apparatuses with at least two different beam paths, respectively, for imaging of structures on a detector, the optics apparatuses being configured to join together, first detecting the images of the structures with the detector and determining distances $dx_1$, $dy_1$ of the images before a subjecting of the substrate to a process, second detecting the images of the structures with the detector and determining distances $dx_2$, $dy_2$ of the images and distances $dx_n$, $dy_n$ after the subjecting of the substrate to the process, and generating stress and/or strain maps based on the second determining of the distances, wherein $dx_1$ and $dy_1$ are respective distances in X and Y directions of the images of the structures before the substrate is subjected to the process, wherein $dx_2$ and $dy_2$ are respective distances in X and Y directions of the images of the structures after the substrate is subjected to the process, wherein $dx_n$ is a distance between $dx_1$ and $dx_2$, wherein $dy_n$ is a distance between $dy_1$ and $dy_2$, wherein the first and second determining of the distances have the distances determined by superpositioning or combining the beam paths, and wherein no calibration of the optics is necessary.

12. The method as claimed in claim 11, wherein the changes in the shape of the substrate comprise strains and/or distortions along the substrate surface.

13. The method as claimed in claim 11, further comprising the step of respectively focusing, via the detector, the optics apparatuses on corresponding ones of the structures prior to the first detecting of the images.

* * * * *